United States Patent [19]

Glasby

[11] Patent Number: 4,475,237
[45] Date of Patent: Oct. 2, 1984

[54] PROGRAMMABLE RANGE RECOGNIZER FOR A LOGIC ANALYZER

[75] Inventor: Dennis E. Glasby, Beaverton, Oreg.

[73] Assignee: Tektronix, Inc., Beaverton, Oreg.

[21] Appl. No.: 325,173

[22] Filed: Nov. 27, 1981

[51] Int. Cl.³ .............................................. G06K 9/00
[52] U.S. Cl. ................................. 382/10; 340/146.2; 364/736; 371/67; 382/34; 382/57
[58] Field of Search ........................ 382/34, 48, 57, 10; 371/67, 68; 340/146.2; 364/736–738, 741, 768–769

[56] References Cited

U.S. PATENT DOCUMENTS

| | | | |
|---|---|---|---|
| 3,303,463 | 2/1967 | Hamburgen | 382/57 |
| 3,492,646 | 1/1970 | Bene et al. | 382/34 |
| 3,573,730 | 4/1971 | Andrews et al. | 382/34 |
| 4,010,445 | 3/1977 | Hoshino | 382/57 |
| 4,030,068 | 6/1977 | Banz | 382/48 |
| 4,032,885 | 6/1977 | Roth | 382/34 |
| 4,100,532 | 7/1978 | Farnbach | 382/1 |
| 4,227,175 | 10/1980 | Newman | 382/34 |

Primary Examiner—Leo H. Boudreau
Attorney, Agent, or Firm—George T. Noe

[57] ABSTRACT

A programmable range recognizer produces a recognition signal whenever a digital word occurs within a specified closed range of digital words. Such a programmable range recognizer is useful for triggering or data qualification in a logic state analyzer. The range recognizer comprises a random-access memory divided into a plurality of sections, each for decoding a corresponding byte of the digital word, and a combination logic circuit for combining decoded bits to produce a recognition output.

7 Claims, 6 Drawing Figures

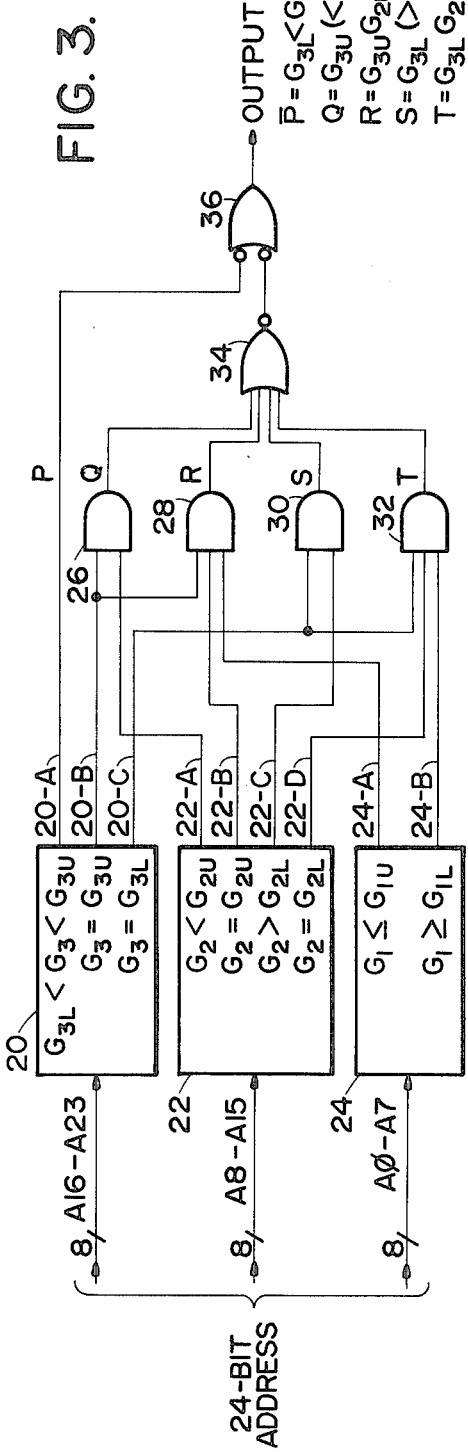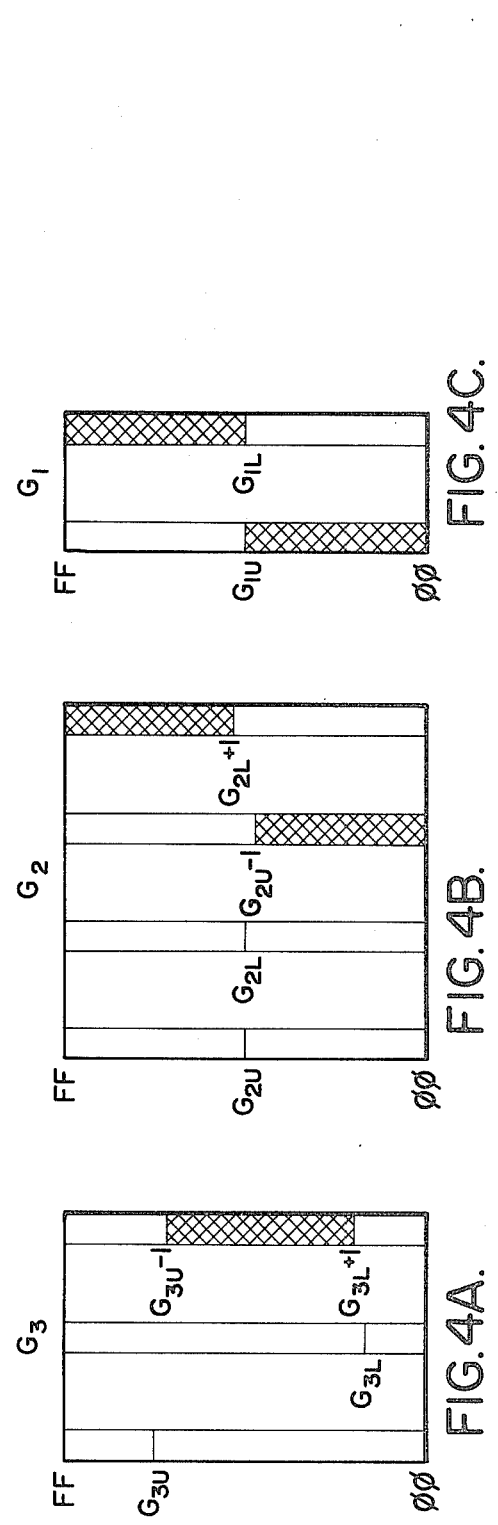

PROGRAMMABLE RANGE RECOGNIZER FOR A LOGIC ANALYZER

BACKGROUND OF THE INVENTION

The present invention is concerned generally with logic analysis instruments capable of selecting data or being triggered within a predetermined range of addresses, and more particularly to a programmable range recognizer for a logic analyzer.

A logic analyzer is an electronic instrument which captures and displays the flow of events in the form of logic states of parallel-bit data occurring in a digital system. The data which are acquired for display are first stored in a memory device, and because of limited acquisition memory space, the starting point for data collection must first be defined and the information to be stored first must be selected in order to store only that to be displayed. Defining the starting point and selecting the data to be captured are known in the logic analyzer art as triggering and qualification, respectively. Typically, so-called word recognizers, which are set to recognize a specific pattern of parallel bits, or digital words, are utilized for both triggering and data qualification. In more sophisticated logic analyzers, particular sequences of events rather than a single digital word may be specified for triggering or data qualification.

In using the logic analyzer to analyze software and hardware situations associated with microprocessors, it is often desirable to be able to trigger on a range of words, such as, for example, a range of addresses on the address bus, or to qualify such data for acquisition. Furthermore, it would be desirable that such a range recognizer be programmable to provide a flexible range recognition system for triggering or data qualification. However, for wide address buses, for example, for a common bus width of 24 bits, implementation of address range recognition has been considered impractical and rather cumbersome because of the huge number of address possibilities.

SUMMARY OF THE INVENTION

In accordance with the present invention, a programmable range recognizer produces a signal for triggering or data qualification whenever a digital word occurs within a specified closed range of digital words.

In general, a random-access memory (RAM) coupled to a parallel-bit signal line, such as an address bus, contains a stored bit pattern, or mask, which is predetermined in accordance with an algorithm defining the closed range of digital words. As such, the RAM is utilized to decode the address information on the bus. To accommodate operation in accordance with the algorithm, the RAM is divided into a plurality of sections, each of which corresponds to a predetermined bit segment or byte of the parallel-bit signal. Each section is further divided into subsections, the number of subsections depending upon the number of byte equality or inequality needed to provide complete information. The decoded output bits of each subsection are combined in a combination logic circuit to provide complete information in accordance with the algorithm as to whether a particular data word on the parallel-bit signal line is within the defined recognition range.

The preferred embodiment exploits the relation $G = 2^8 = 16^2 = 256$ to split a 24-bit parallel address signal into three bytes $G_3$, $G_2$, and $G_1$ so that a 24-bit wide address bus may be decoded by three statis RAMs. The combination logic circuit may suitably be a commercially-available 4-wide, 3-2-3-2 input AND/OR invert gate integrated circuit. Only one additional gate element is required to complete the entire range recognizer. Thus, the range recognizer according to the preferred embodiment may be fabricated using only five components, making it particularly attractive for use in multiple-channel logic analyzers where many range recognizers are needed.

It is therefore one object of the present invention to provide a novel range recognizer for a logic analyzer apparatus.

It is another object of the present invention to provide a programmable range recognizer which produces a trigger or data qualification signal whenever a digital word occurs within a specified closed range of digital words.

It is a further object of the present invention to provide a range recognizer which operates in accordance with a simple algorithm.

It is an additional object and feature of the present invention to provide a programmable range recognizer which may be implemented with a comparatively few components and which consumes comparatively little power.

Other objects, advantages, and features of the present invention will become apparent to those having ordinary skill in the art from a reading of the following detailed description when taken in conjunction with the accompanying drawings.

BRIEF DESCRIPTION OF THE DRAWINGS

FIG. 3 is a detailed schematic of a preferred embodiment of the present invention; and FIGS. 4A–4C are bar charts of respective RAMs of FIG. 3.

DETAILED DESCRIPTION OF THE INVENTION

Figure 1:
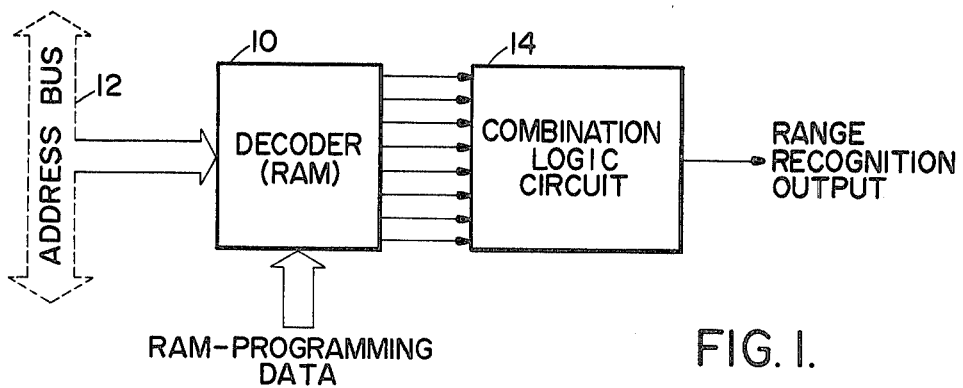
FIG. 1 is a block diagram of a programmable range recognizer in accordance with the present invention.
Figure 2:
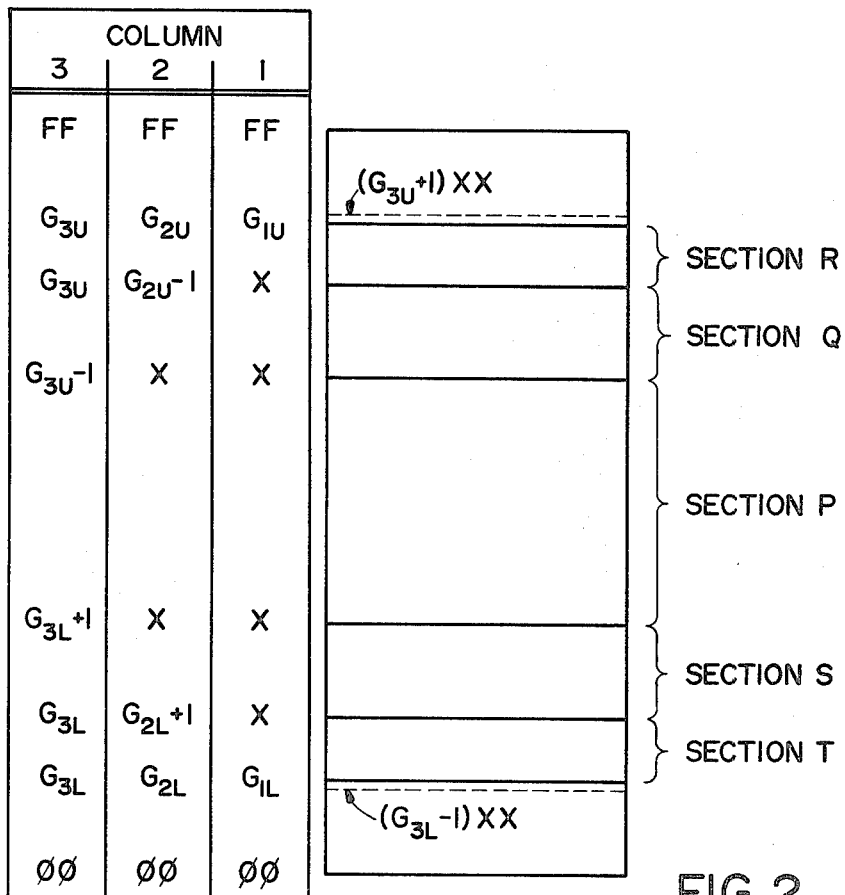
FIG. 2 is a bar chart depicting a 24-bit address field of the random-access memory portion of the system of FIG. 1.

Referring now to FIGS. 1 and 2, there is shown a random access memory (RAM) and a bar chart of the address field thereof to be operated as a decoder 10. The decoder 10 is connected to an n-bit parallel signal path, such as an address bus 12, which may be associated with a microprocessor or a microprocessor-based system for which it is desired to generate a triggering or data qualification signal if an address occurs within a closed range of addresses.

To exemplify the huge number of address possibilities capable of being accommodated by the present invention, the bar chart of FIG. 2 shows six hexadecimal digits (digits in powers of 16), indicating from the relation $2^{24} = 16^6 = 16,777,216$ a 24-bit binary address bus width with 16,777,216 address possibilities over the range 000000 to FFFFFF. These six hexadecimal digits are divided into three bytes of two hexadecimal digits each wherein $G_1$ is the least significant byte (column 1 in FIG. 2), $G_2$ is the middle byte (column 2), and $G_3$ is the most significant byte (column 3). The letter U designates the upper bound bytes of the address range, e.g., $G_{3U}\, G_{2U}\, G_{1U}$, while the letter L designates the lower bound bytes of the address range, e.g., $G_{3L}\, G_{2L}\, G_{1L}$.

The decoder 10 is preprogrammed by a mask set up prior to operation by a controlling processor, which may be a different processor than the microprocessor associated with address bus 12. The mask, or bit pattern to be stored in the decoder RAM, is predetermined in accordance with an algorithm defining the closed range of digital words defining the address range $G_{3L}$ $G_{2L}$ $G_{1L} \leq G_3$ $G_2$ $G_1 \leq G_{3U}$ $G_{2U}$ $G_{1U}$. To accommodate operation in accordance with this algorithm, the RAM is divided into a plurality of sections, three in this example, each of which corresponds to one of the bytes $G_1$, $G_2$, or $G_3$. Each section is further divided into subsections, the number of subsections depending upon the number of equality or inequality possibilities of each byte needed to provide complete information. The RAM-programming data in accordance with the mask as determined from the algorithm is loaded by the controlling processor into the subsections. The decoded output bits from each subsection are applied to a combination logic circuit 14 to provide complete information in accordance with the algorithm as to whether a particular digital word $G_3$ $G_2$ $G_1$ is within the defined recognition range, in which case an output signal is generated.

Referring again to the bar chart of FIG. 2, it can be seen that the address field is arranged to most expeditiously determine whether an address $G_3$ $G_2$ $G_1$ is within the recognition range. The recognition range is indicated by the partitioned sections P, Q, R, S, and T, and a recognition signal for triggering or data qualification will be generated if the address falls within any of these sections. Where the least significant byte does not matter, an X is shown in column 1 to indicate the "don't care" situation. For example, looking at Section Q, it can be seen that if $G_3 = G_{3U}$, and if $00 \leq G_2 \leq (G_{2U} - 1)$, it does not matter what $G_1$ is because the composite word $G_3 G_2 G_1$ must be in range. This may be verified by substituting decimal numbers for the designated bytes. In addition, it can be seen that if $G_3 \geq (G_{3U} + 1)$ or if $G_3 \leq (G_{3L} - 1)$, it does not matter what $G_2$ or $G_1$ are because it can be determined from the most significant byte alone in these specific cases that the word $G_3 G_2 G_1$ is out of range. Similarly, if $(G_{3L} + 1) \leq G_3 \leq (G_{3U} - 1)$, it can readily be determined that $G_3$ $G_2$ $G_1$ is within range without investigating $G_2$ or $G_1$. These situations may be exploited in the range recognizer of the present invention by providing an override signal which bypasses the combination logic circuit 14.

It is expedient when entering the mask into the RAM sections to utilize a logical one for a "true" or "don't care," and a logical zero for a "false" in most instances. However, depending upon the particular implementation and logic elements used, the override bit may have the opposite polarity for true and false. Thus, a specific pattern of ones and zeros, or the complement thereof, may be used, especially for the override bit as discussed above for the out-of-range situation.

The software to load the RAM sections with the correct mask follows the algorithm exactly, except in two cases. First, if $G_{3L} = G_{3U}$, or if $(G_{3L} + 1) = G_{3U}$, Section P is converted to a "don't care." Also, for the specific case of $G_{3L} = G_{3U}$, Section Q is also converted to a "false," and the middle byte of Section S is changed to the expression "$(G_{2L} + 1)$ to $(G_{2U} - 1)$" rather than "$(G_{2L} + 1)$ to FF." Second, if $G_{3L} = G_{3U}$ and $G_{2L} = G_{2U}$ (or $G_{2L} + 1) = G_{2U}$), Section Q and Section S are both "false." For the specific case of $G_{3L} = G_{3U}$ and $G_{2L} = G_{2U}$, Section R is also "false" and the least significant byte of Section T changed to the expression "$G_{1L}$ to $G_{1U}$."

The preferred embodiment of the present invention is directed to a 24-bit system and is shown in FIG. 3. Here, the relation $G = 2^8 = 16^2 = 256$ is exploited, allowing a 24-bit address word to be split into three bytes $G_3$, $G_2$, and $G_1$, each comprising two hexadecimal digits as described hereinabove, to be decoded by three static RAMs. The upper byte $G_3$ is applied via address lines A16–A23 to a 256-word by 3-bit programmable RAM 20 which is preprogrammed in accordance with the bar chart of FIG. 4A. The middle byte $G_2$ is applied via address lines A8–A15 to a 256-word by 4-bit programmable RAM 22, which is preprogrammed in accordance with the bar chart of FIG. 4B. Similarly, the lower byte $G_1$ is applied via address lines A0–A7 to a 256-word by 2-bit programmable RAM 24, which is preprogrammed in accordance with the bar chart of FIG. 4C.

The output lines of RAM 20 are labeled 20-A, 20-B, and 20-C, and the output logic bits may be determined from a perusal of FIG. 4A. First, it can be seen that the value of $G_3$ must be between 00 and FF. The cross-hatched area between $(G_{3L} + 1)$ and $(G_{3U} - 1)$ for one of the bits indicates a "true," as do the solid line at $G_{3U}$ and $G_{3L}$ for the other two bits. The blank spaces indicate a "false." The equations relating to the bit patterns of FIG. 4A are set forth for illustrative purposes inside the rectangle labeled RAM 20 of FIG. 3. As an example, if the value of $G_3$ falls between $(G_{3L} + 1)$ and $(G_{3U} - 1)$, the equation $G_{3L} < G_3 < G_{3U}$ is true, and therefore output line 20-A is true while lines 20-B and 20-C are false. Of course, if $G_3 = G_{3U}$ or $G_3 = G_{3L}$, then either line 20-B or 20-C, respectively, will be true while the other two lines are false.

The same concept holds true for RAMs 22 and 24 and their respective address space bar charts of FIGS. 4B and 4C. Again, the solid or cross-hatched areas within the depicted address space indicate a "true," while the blank areas indicate a "false."

The various output bits of the RAMs 20, 22, and 24 are combined in a combination logic circuit comprising four AND gates 26, 28, 30, and 32, and NOR gate 34. The combination logic circuit may be fabricated of discrete logic gates; however, for the particular embodiment shown, this circuit is commercially available as a 4-wide, 3-2-3-2 input AND/OR invert gate 74S64 integrated circuit. A NAND gate 36 is connected to the output of NOR gate 34 and output line 20-A to provide a range of recognition output signal. Because of the specific implementation of the combination logic circuit, a "true" on line 20-A is actually a logical zero, while for all of the other cases for RAMs 20, 22, and 24, a "true" is a logical one. Line 20-A is the override line as described earlier, because if $G_{3L} < G_3 < G_{3U}$, it does not matter what bytes $G_2$ and $G_1$ are. The output equations $\overline{P}$ through T for a valid in-range status of the 24-bit address word are shown at the range recognizer output, and these equations may be verified academically from FIGS. 3 and 4A through 4C.

While I have shown and described herein the preferred embodiment of my invention, it will be apparent to those skilled in the art that many changes and modifications may be made without departing from my invention in its broader aspects. For example, a specific bit pattern or its complement may be used for any of the RAM subsections, depending upon the logic elements used, or whether it would be more expedient to direct an out-of-range condition rather than an in-range condition. Additionally, the mask may be set up to provide open-range recognition since the upper bound could be equal to FFFFFF or the lower bound equal to 000000, or left justified or right justified "don't cares," e.g., XXFFFF, could be used to provide a 16-bit range recognizer. Therefore, the scope of the present invention should be determined only by the following claims.

What I claim as being novel is:

1. A method of recognizing digital words occurring within a closed range of such words, comprising the steps of:
 (a) splitting the digital words into a plurality of word segments each defining a range of numbers having an upper bound and a lower bound;
 (b) decoding each of said word segments in a separate memory section programmed with predetermined upper bound and lower bound values and producing output bits when the numerical value of each of said word segments is equal to one of said predetermined upper bound and lower bound values, and when the numerical value of each of said word segments is between said predetermined upper bound and lower bound values; and
 (c) combining ones of said output bits to thereby produce a recognition output.

2. A method in accordance with claim 1 wherein said word segments are bytes ranging from most significant to least significant, and wherein said decoding is done by a random-access memory having a memory section corresponding to each byte.

3. A system for recognizing digital words occuring within a closed range of such words, comprising:
 means for splitting the digital words into a plurality of word segments each defining a range of numbers having an upper bound and a lower bound;
 means for decoding each of said word segments in a separate memory section programmed with predetermined upper bound and lower bound values and producing decoded output bits when the numerical value of each of said word segments is equal to one of said predetermined upper bound and lower bound values, and when the numerical value of each of said word segments is between said predetermined upper bound and lower bound values; and
 means for combining ones of said output bits to thereby product a recognition output.

4. A system in accordance with claim 3 wherein said word segments are bytes ranging from most significant to least significant, and wherein said decoding means comprises random-access memory means having a memory section corresponding to each byte.

5. A system in accordance with claim 4 wherein each of said memory sections is divided into subsections each containing one of an upper bound value, a lower bound value, and a range of values, wherein output bits may be provided by one or more subsections.

6. A system in accordance with claim 4 wherein said random-access memory means is programmable.

7. A programmable range recognizer, comprising:
 means for splitting digital words into bytes ranging from a most significant byte to a least significant byte;
 a random-access memory having a plurality of sections, each section corresponding to a respective one of said bytes and being divided into subsections each containing one of a stored upper bound value, lower bound value, and a range of values therebetween, wherein decoded output bits are provided from said subsections when the byte value is true; and
 a combination logic circuit comprising a plurality of logic elements for combining said output bits to produce a range recognition signal.

* * * * *